United States Patent [19]

Yamamoto et al.

[11] Patent Number: 5,424,282
[45] Date of Patent: * Jun. 13, 1995

[54] PROCESS FOR MANUFACTURING A COMPOSITE OXIDE SUPERCONDUCTING WIRE

[75] Inventors: Susumu Yamamoto; Teruyuki Murai; Nozomu Kawabe; Tomoyuki Awazu; Shuji Yazu; Tetsuji Jodai, all of Hyogo, Japan

[73] Assignee: Sumitomo Electric Industries, Ltd., Osaka, Japan

[*] Notice: The portion of the term of this patent subsequent to Mar. 6, 2007 has been disclaimed.

[21] Appl. No.: 200,540

[22] Filed: Feb. 22, 1994

Related U.S. Application Data

[60] Continuation of Ser. No. 936,313, Aug. 28, 1992, abandoned, which is a continuation of Ser. No. 825,578, Jan. 24, 1992, Pat. No. 5,169,831, which is a division of Ser. No. 189,366, May 2, 1988, Pat. No. 5,122,507.

[30] Foreign Application Priority Data

| May 1, 1987 | [JP] | Japan | 62-108120 |
| May 6, 1987 | [JP] | Japan | 62-110289 |
| May 7, 1987 | [JP] | Japan | 62-111582 |
| Jun. 10, 1987 | [JP] | Japan | 62-144366 |
| Sep. 14, 1987 | [JP] | Japan | 62-230638 |

[51] Int. Cl.$^6$ .................................. H01L 39/24
[52] U.S. Cl. ................. 505/433; 505/434; 505/430; 505/704; 29/599; 427/62; 174/125.1; 428/930
[58] Field of Search ............ 505/430, 433, 434, 432, 505/704; 427/62; 174/125.1; 428/930; 29/599

[56] References Cited

U.S. PATENT DOCUMENTS

| 3,932,315 | 1/1976 | Sleight . | |
| 4,826,808 | 5/1989 | Yurek et al. | 505/1 |
| 4,906,609 | 3/1990 | Yamauchi | 505/740 |
| 4,952,554 | 8/1990 | Jin et al. | 505/704 |
| 4,994,432 | 2/1991 | Hermann | 505/1 |
| 5,011,823 | 4/1991 | Jin | 505/1 |
| 5,030,616 | 1/1991 | Yamamoto | 505/1 |
| 5,081,075 | 1/1992 | Jin | 505/1 |
| 5,100,865 | 3/1992 | Yamamoto | 505/704 |

FOREIGN PATENT DOCUMENTS

| 0281474 | 9/1988 | European Pat. Off. . |
| 0292126 | 11/1988 | European Pat. Off. . |
| 60-173885 | 9/1985 | Japan . |
| 61-131307 | 6/1986 | Japan . |

OTHER PUBLICATIONS

"Microstructural and Electromagnetic Characterization", D. C. Larbalestier et al, Applied Superconductivity Center and Department of Metallurgical and Mineral Engineering, University of Wisconsin, Madison, Wis., 1987 Mar. 18.

"Bulk and Wire Type Y—Ba—Cu Oxide Superconductor", Yamada et al, Int. Conference on Low Temperature Physics, Kyoto, 1987 Japanese Journal of Applied Physics, vol. 26 (1987) Supplement 26-3.

"Super Conducting Tape-Shaped Wire", S. Matsuda et al, pp. 695–698, Hitachi Research Laboratory of Hitachi Ltd., Hitachi, Japan, Nov. 30, 1987.

(List continued on next page.)

Primary Examiner—Roy V. King
Attorney, Agent, or Firm—Kerkam, Stowell, Kondracki & Clarke; William L. Feeney

[57] ABSTRACT

A process for producing a composite oxide superconducting wire is disclosed, which comprises the steps of compacting material powder for an oxide superconductor in a noble metal pipe; heating the metal pipe filled with the material powder at a temperature ranging between an upper limit corresponding to the lowest melting point of any one of constituent components in the material powder and a lower limit which is lower by 100° C. than said upper limit to sinter the material powder and cooling the product at a cooling velocity of less than 50° C./min, and further including a series of wire-drawing, annealing and sintering steps. Furthermore, an intermediate layer of noble metal can be interposed between the oxide superconductor and the metal pipe.

35 Claims, 5 Drawing Sheets

OTHER PUBLICATIONS

"Fabrication and Superconducting Properties of High $T_c$ Oxide Wire", N. Sadakata et al, Materials Research Society, pp. 293-296, Nov. 30, 1987.

"Fabricaiton of Multifilamentary Y—Ba—Cu—O Oxide Superconductor", H. Sekine et al, *Appl. Phys. Lett* 52(26), Jun. 27, 1988, pp. 2261-2262.

Ashi Newspaper, Masumoto et al, Mar. 10, 1987.

"A New Route to Oxide Superconductors", Arthur L. Robinson, Science vol. 236, Jun. 19, 1987, p. 1526.

"Possible High $T_c$ Superconductivity in the Ba—La—Cu—O System" J. G. Bednorz and K. A. Muller, IBM Zurich Research Laboratory, Ruschukon, Switzerland, Z. Phys. B—Condensed Matter 64, pp. 189-193 (1986).

"An Epoch-Making Superconducting Material", Yomiuri Shimbun, (Chu article), Feb. 16, 1987, Kyodo, Japan.

"High $T_c$ Superconductors—Composite Wire Fabrication", S. Jin et al, *Appl. Phys. Lett.,* 51 (3), Jul. 20, 1987, pp. 203-204.

"Critical Temperature and Critical Current Density of La—Sr—Cu Oxide Wires", Osamu Kohno et al, *Japanese Journal of Applied Physics,* vol. 26, No. 5, May 1987, pp. L759-L760.

"Problems In the Production of $YBa_2Cu_3O_x$ Superconducting Wire", R. W. McCallum et al, *Advanced Ceramic Materials,* vol. 2, No. 3B, Special Issue 1987, pp. 388-400.

Sheng et al, Nature vol. 332, 3 Mar. 1988, pp. 55-57.

Maeda et al, Jap Jour of App Phys. vol. 27, No. 2, Feb. 1988, pp. L209-L210.

FIG. 1
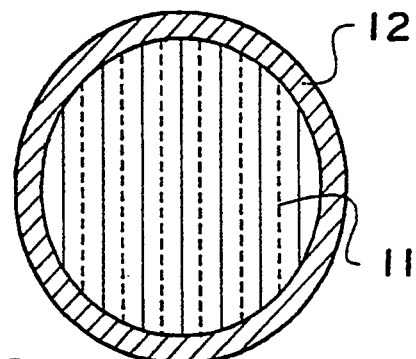
FIG. 2
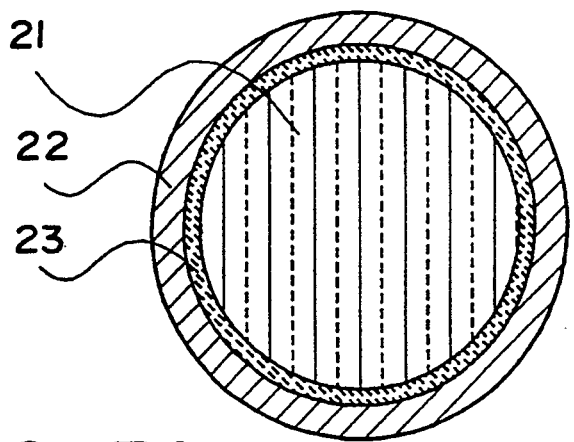
FIG. 3A
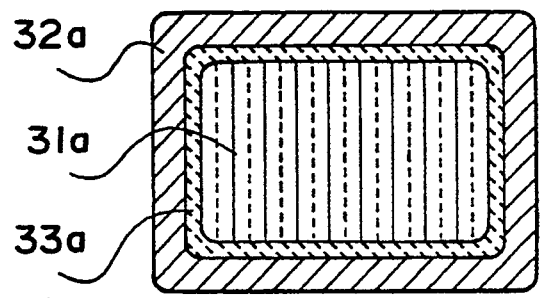
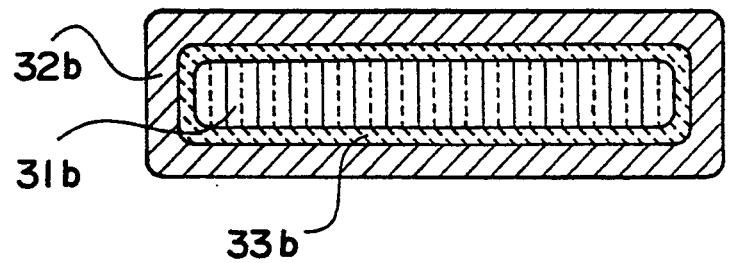
FIG. 3B

PROCESS FOR MANUFACTURING A COMPOSITE OXIDE SUPERCONDUCTING WIRE

This is a continuation, of application Ser. No. 936,313, filed Aug. 28, 1992 which is a continuation of Ser. No. 07/825,578 filed Jan. 2, 1992, now U.S. Pat. No. 5,169,831, which is a divisional of serial no 07/189,366 filed May 2, 1988, now U.S. Pat. No. 5,122,507.

BACKGROUND OF THE INVENTION

1. Field of the Invention

The present invention relates to a composite having superconducting property and a process for manufacturing the same. Particularly, it relates to a process for manufacturing a superconducting composite, such as a wire having hiker and stable critical temperature and critical current density.

2. Description of the Related Art

Under the superconducting condition, the perfect diamagnetism is observed and no difference in potential is observed for all that an electric current of a constant finite value is observed internally, and hence, a variety of applications of superconductivity have been proposed in a field of electric power transmission as a mean for delivering electric power without loss.

The superconductivity can be utilized in the field of power electric applications such as MHD power generation, power transmission, electric power reservation or the like; in the field of transportation such as magnetic levitation trains or magnetically propelling ships; a high sensitive sensors or detectors for sensing very weak magnetic field, microwave, radiant ray or the like, in the medical field such as high-energy beam radiation unit; in the field of science such as NMR or high-energy physics; or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2 K. at most. This means that liquidized helium (boiling point of 4.2 K.) is only one cryogen which can realize such very low temperature of Tc. However, helium is not only a limited costly resource but also require a large-scaled system for liquefaction. Therefore, there had been a strong demand for another superconducting materials having higher Tc. But no material which exceeded the abovementioned Tc had been found for all studies for the past ten years.

It has been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These type superconductors, however, possess a rather lower transition temperature of about 10 K. and hence usage of liquidized helium (boiling point of 4.2 K.) as cryogen is indispensable to realize superconductivity.

Possibility of existence of a new type of superconducting materials having much higher Tc was revealed by Bednorz and Müller who discovered a new oxide type superconductor in 1986 [Z. Phys. B64(1986) 189]

This new oxide type superconducting material is [La, Ba]$_2$CuO$_4$ or [La, Sr]$_2$CuO$_4$ which are called as the $K_2NiF_4$-type oxide having a crystal structure which is similar to known perovskite type oxide. The $K_2NiF_4$-type oxides show such higher Tc as 30 K. which are extremely higher than the known superconducting materials and hence it becomes possible to use liquidized hydrogen (b.p.=20.4 K.) or liquidized neon (b.p.=27.3 K.) as a cryogen which bring them to exhibit the superconductivity.

It was also reported in the newspaper that C. W. Chu et al discovered in the United States of America another type of superconducting material having the critical temperature of in the order of 90 K. in Feb. 1987, and hence possibility of existence of high-temperature superconductors have burst on the scene.

However, the above mentioned new type superconducting materials which was just born have been studied and developed only in a form of sintered bodies as a bulk produced from powders but have not been tried to be shaped into a wire form. The reason is that the new type superconductors are ceramic materials of compound oxide which do not possess enough plasticity or can not be worked easily in comparison with well-known metal type superconducting materials such as Ni-Ti alloy, and therefore they can not or are difficult to be shaped or deformed into an elongated article such as a wire by conventional technique such as wire-drawing technique in which superconducting metal is drown directly or in embedded condition in copper into a wire form.

Still more, the above mentioned sintered ceramic materials must be shaped into an elongated structure when they are used as a superconducting wire in practice. However, the above mentioned superconducting materials obtained in a form of a sintered body are very fragile and are apt to be broken or cracked under even very weak mechanical stress. And hence, when they are shaped into a wire, special attention must be paid for their handling in order not to be broken.

It is proposed in Japanese patent laid-open No. 61-131,307 a method for manufacturing a superconducting wire from a metal type superconducting material which is apt to be oxidized and very fragile such as PbMo$_{0.35}$S$_8$, comprising charging the material metal powder in a metal shell, extruding the metal shell filled with the material powder at a temperature of higher than 1,000° C. and then drawing the extruded composite. This metal working technique, however, can not apply directly to ceramic material consisting of compound oxide, because the compound oxide type superconducting materials can not exhibit the superconductivity if not the specified or predetermined crystal structure is realized. In other words, a superconducting wire which shows higher critical temperature and higher critical current density and which is useable in actual applications can not be obtained outside predetermined optimum conditions. In particular, if the shell is not selected from proper materials, the resulting compound oxide will be reduced due to chemical reaction with the metal of the shell, resulting in poor or inferior properties of superconductivity.

A polycrystal having completely uniform crystal structure can not be obtained from particles having superconducting properties alone. Still more, the phenomenon of superconductivity is apt to be easily broken in stronger magnetic field and under the fluctuation or unhomogeneous distribution of temperature in the sintered body as well as the abovementioned oxide type superconducting materials possess rather higher specific resistance and lower heat-conductivity above the critical temperature. Therefore, if the phenomenon of superconductivity breaks locally, the sintered body produces Joule heat caused by the superconducting current preserved therein and explosive evaporation of cryogen is induced when the heated portion of the sintered body contacts with the cryogen. In order to avert this danger, in conventional metal type superconducting material, superconducting metal is shaped in a form of a fine wire or filament a plurality of which are embedded in electroconductive metal which play a roll of a by-pass of electric current when superconductivity breaks.

The oxide type superconducting materials are, however, difficult to be shaped or deformed into such filaments, because they have not enough plasticity or processability in comparison with well-known metal type superconducting materials such as Ni-Ti alloy.

In order to realize a reliable and practical superconducting structure, it is indispensable that the structure possesses enough strength and tenacity which is sufficient to endure bending force during usage and also has as finer cross sectional dimension as possible in such manner that it can transmit currency at higher critical current density and at higher critical temperature. However, conventional techniques can not or are difficult to produce wire shaped ceramic articles possessing satisfactory mechanical strength and tenacity as well as a higher dimensional ratio of length to cross section.

Taking the abovementioned situation into consideration, the present inventors have proposed processes for producing sintered ceramic wires having a practically usable higher dimensional ratio of length to cross section without using organic binder which is a cause of deterioration of strength and tenacity in copending United State of America patent application serial No. 152,713 titled "Process for manufacturing a superconducting wire of compound oxide-type ceramic" filed in Feb. 5, 1988, now abandoned and Ser. No. 161,480 titled "Process for manufacturing a compound oxide-type superconducting wire" filed in Feb. 28, 1988, now abandoned in which a metal pipe filled with material powder is subjected to plastic deformation such as wire-drawing technique by means of a die and then is sintered.

These solutions are themselves satisfactory but the present inventors have continued to develop another process which can produce a ceramic wire possessing higher strength and no breakage and complete the present invention.

Therefore, an object of the present invention is to overcome the abovementioned problems of the conventional technique and to provide an improved process for producing a 'superconducting wire-like composite which has a higher Tc and higher stability as superconductor which can be applicable to practical uses.

SUMMARY OF THE INVENTION

The present invention provides a wire-like composite comprising a compound oxide type superconductor and an outer metal pipe on which said superconductor is supported, characterized in that a layer composed of at least on of precious metals selected from a group comprising gold, silver and platinum metals and their alloys is interposed at an interface between the compound oxide type superconductor and the outer metal pipe.

More precisely, according to the present invention, the wire-like composite including a compound oxide type superconductor and an outer metal pipe on which said superconductor is supported is characterized in that (i) said outer metal pipe is made of at least on of metals selected front a group comprising gold, silver and platinum metals and their alloys, or (ii) an intermediate layer composed of at least on of metals selected from a group comprising gold, silver and platinum metals and their alloys is interposed between said compound oxide type superconductor and said outer metal pipe.

Now, each of the cases (i) and (ii) will be described in more in details.

Case I - The outer metal pipe is made of precious metals (I-1) A solid composite In this case, the outer metal pipe is made of Ag, Au or platinum elements of Pd, Pt, Rh, Ir, Ru, Os or their alloys and surrounds or covers a sintered body of compound oxide.

According to this embodiment, the superconductor is compacted in the outer metal pipe made of precious metals having a lower electrical resistance, a higher specific heat and a higher heat conductivity, so that the resulting solid wire-like composite shows higher mechanical strength because a fragile sintered article is supported by a metallic sheath having relatively higher strength and tenacity than the sintered article.

Still more, according to the present invention, oxygen contents in the superconducting sintered body can be stabilized because of the presence of the outer metal pipe. In fact, the oxygen contents of the abovementioned compound oxides such as an oxide containing a IIa element and a IIIa element which can be used advantageously in the present invention may vary or change if they contact directly with a metal which is liable to be oxidized. To solve this problem, according to the present invention, the outer metal pipe is made of at least one of precious metals selected from gold, silver, platinum metals or their alloys to enclose the oxide therein so that the variation of oxygen contents in the compound oxide is suppressed.

An inner surface of the metal pipe may further have a protective layer which "resists to oxidation so that the oxygen contents in the compound oxide is maintained within an optimum rage. This protective layer may be made of an oxide such as AgO produced by oxidizing the inner surface of the metal pipe.

The outer metal pipe may have perforations or through holes which make a part of the superconductor open to an atmosphere. To realize such structure, the outer metal pipe may be made of a cylindrical wire netting surrounding tightly the solid superconductor.

A metal wire Or wires may be embedded in the superconductor. The wires are preferably surface-treated with a material which is inert or inactive with respect to the superconductor.

The solid composite abovementioned is produced by a process according to the present invention characterized by the steps comprising preparing at least one of material powders selected from a group comprising
   (i) a powder mixture of compounds each containing at least one of constituent elements of the compound oxide and
   (ii) a sintered powder of compound oxide prepared by sintering the powder mixture of (i) and then by pulverizing obtained sintered body,
compacting the material powder in a metal pipe made of at least on of metals selected from a group comprising gold, silver and platinum metals and their alloys, and then heating the metal pipe filled with the material powder at a temperature raging between an upper limit corresponding to the lowest melting point of any one of constituent components in the material powder and a lower limit which is lower by 100° C. than said upper limit to sinter said material powder inside the outer metal pipe.

Each of the compounds may be an oxide powder or an carbonate powder of constituent elements of said compound oxide. An atomic ratio of elements in said material powders may be adjusted to the same value as an atomic ratio of constituent elements in said compound oxide to be produced.

The material powder may be compacted under a pressed condition and/or may be granulated previously.

Wire-drawing may be performed during or after the sintering operation. It is also possible to heat-treat a sintered product at a temperature ranging from 160° C. to 700° C. The heat-treatment may be carried out after wire-drawing but before the sintering operation.

Generally the sintering of the material powder may be carded out at a temperature ranging from 500° C. to 1,200° C. in which metal oxide such as AgO is decomposed to Ag and oxygen which do not reduce the compound oxide so that the oxygen contents in the oxide can be maintained at a constant value which is beneficial to the crystal structure and/or oxygen deficiency of superior superconductor of compound oxides.

(I-2) A hollow composite of compound oxide

A hollow composite comprises an outer metal pipe made of Ag, Au or platinum elements of Pd, Pt, Rh, Ir, Ru, Os or their alloys and a layer of compound oxide type superconductor applied or deposited on an inner surface of the metal pipe.

The layer of compound oxide type superconductor may be preferably deposited by sputtering technique on an inner surface of the metal pipe The outer metal pipe may be closed at opposite ends thereof and/or may be filled with inert gas. It is also possible to circulate a coolant through the interior of the hollow pipe.

It is also possible to reduce a cross section of the metal pipe by wire-drawing to obtain a finer pipe after the layer of compound oxide type superconductor is formed on the inner surface of the metal pipe.

It is also possible to form an additional inner protective layer consisting of a material which have lower coefficient of thermal expansion on the superconducting compound oxide layer supported on the inner surface of the metal pipe. The material having lower coefficient of thermal expansion may be Si, zirconlure, $SiO_2$ or glass.

The layer of Superconductor may be formed also by wet-coating technique including application or coating of a thin film layer of superconducting material containing a organic binder on the inner surface followed by sintering thereof.

Case II - An intermediate layer made of precious metal is interposed between the outer metal pipe and the superconductor

(II-1) A hollow composite

In this case, the outer metal pipe may be made of any metal such as copper, iron or the like but an intermediate layer made of precious metals is interposed between the outer metal pipe and the superconductor.

The intermediate layer may be made of Ag, Au, Pd, Pt, Rh, Ir, Ru, Os or their alloys. The metals such as Pt, Au or the like which possess relatively lower free energy ($\Delta G$) for producing their oxides deposited on the inner surface of the metal pipe prevent chemical reaction between the metal pipe with the compound oxide to preserve a constant composition of the superconductor. This intermediate layer may be produced by any known technique such as vacuum-deposition, sputtering, plating, coating or cladding technique in which a precious metal pipe is lined on the inner surface of the outer metal pipe.

The compound oxide type superconductor may be in a form of a layer deposited on an inner surface of the intermediate layer deposited by sputtering technique or by wet-coating technique followed by sintering operation on an inner surface of said metal pipe.

An inner surface of said intermediate layer may be further coated with another supporting layer made of one of materials which has strong adhesive property to said compound oxide type superconductor, which is stable to said compound oxide type superconductor, or which has a relatively lower thermal expansion coefficient with respect to the compound oxide type superconductor such as Si, zirconium, $SiO_2$ or glass.

(II-2) A solid composite

In this case, the compound oxide type superconductor is in a form of a sintered solid mass compacted inside the intermediate layer deposited on the inner surface of the outer metal pipe according to the abovementioned method (II-1). The solid mass compacted in the metal pipe may be produced by the same procedure as (I-1).

Now, the present invention will be described with reference to attached drawings which illustrate preferred embodiments of the present invention but are not limitative of the present invention.

BRIEF DESCRIPTION OF THE DRAWING

FIG. 1 is an illustrative cross sectional view of a solid composite according to the present invention.

FIG. 2 is an illustrative cross sectional view which is similar to FIG. 1 and which shows another embodiment of a solid composite according to the present invention.

FIG. 3A and 3B illustrate two variations of the solid composite shown in FIG. 2.

FIG. 4A and 4B illustrate another embodiment of a composite according to the present invention, wherein FIG. 4A is a cross section thereof and FIG. 4B shows a side elevation thereof.

FIG. 5A and 5B illustrate a variation of the composite shown in FIG. 4, wherein FIG. 5A is a cross section thereof and FIG. 5B shows a side elevation thereof.

FIG. 6A and 6B illustrate still another embodiment of the present invention, wherein, FIG. 6A is a cross section thereof and FIG. 6B is a perspective view thereof.

Referring to FIG. 1 which illustrates a typical composite according to the present invention, the composite shown in FIG. 1 is a superconducting solid round wire comprising a core of a sintered compound oxide 11 and an outer metal pipe 12 made of precious metal such as silver or platinum surrounding tightly the sintered compound oxide 11. In the following description, platinum is used as a material of the metal pipe but is only an example of the material of the outer pipe.

FIG. 2 illustrates another embodiment of a composite which is similar to FIG. 1 but a layer of PtO 23 is interposed between an outer Pt pipe 22 and a sintered mass of compound oxide 21 compacted in the Pt pipe 22. The PtO layer 23 can be produced previously by heating an inner surface of the Pt pipe 22 in air and will supply oxygen produced by thermal decomposition thereof at the following sintering stage to the superconducting material filled therein to control the oxygen contents of the sintered compound oxide to a proper value.

Two variations shown in FIG. 3A nd 3B illustrate a rectangular superconducting wire or rod and a flat tape-like superconductor according to the present invention. In these variations, a sintered mass 31a and 31b is enclosed in an outer Pt pipe 32a or in a platinum band 32b through an interface layer of PrO 33a and 33b. The composite of FIG. 3A may be produced by deforming a round pipe or by using a rectangular pipe or can be manufactured by a process including steps of molding rectangular superconductor and then covering the molded article with a metal sheath.

Figure 4A:
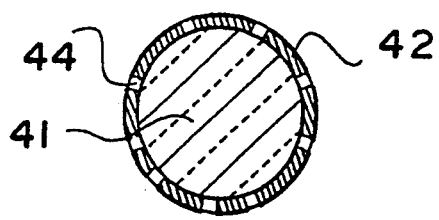
Figure 5A:
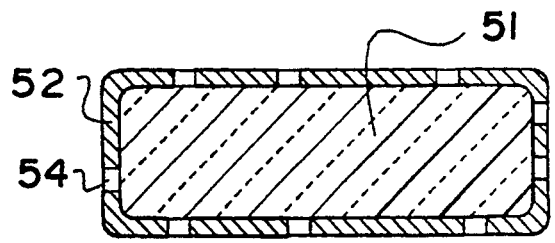
Figure 4B:
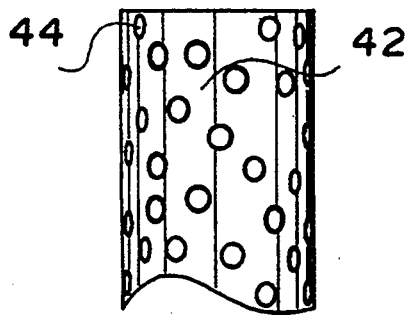
Figure 5B:
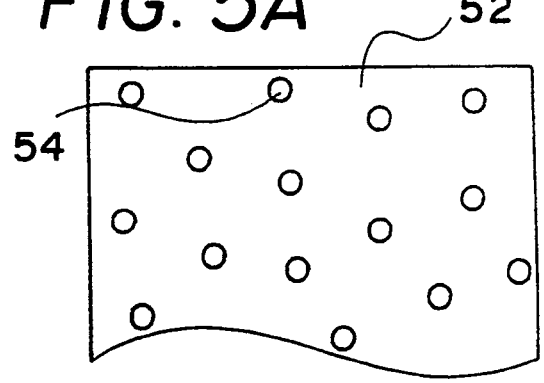
Figure 6A:
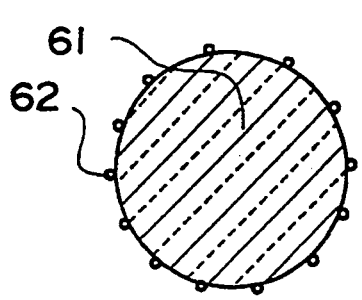
Figure 6B:
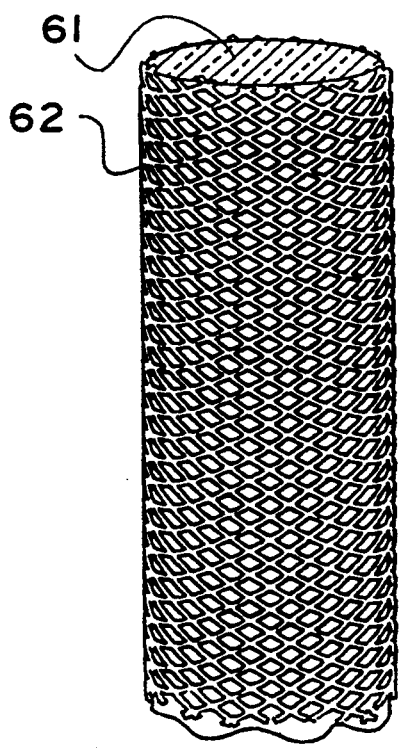

Still another embodiment of a composite according to the present invention shown in FIG. 4A and 4B is similar to the composite of FIG. 1, but the outer pipe 42 has perforations or through-holes 44 which make the inner core 41 exposed to surroundings. FIG. 5A and FIG. 5B illustrate a variation of a composite shown in FIG. 4. The composite of FIG. 5 has a rectangular cross section. In still another embodiment shown in FIG. 6, the outer metal pipe shown in FIG. 1 is displaced by a wire netting 62 which envelopes an inner core of sintered compound oxide 61. In the embodiments of FIG. 4 to 6, the core of compound oxides 41, 51 and 61 can contact directly with atmosphere to permit to facilitate the control of oxygen contents in the sintered compound oxide during, sintering stage.

Figure 7:
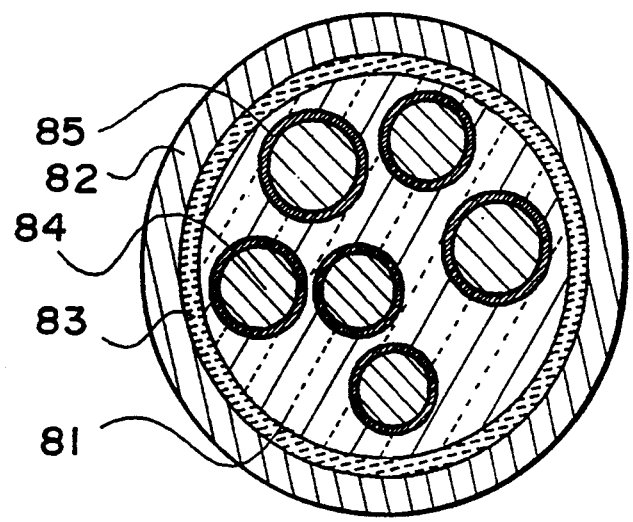
FIG. 7, 8 and 9 are cross sectional views of still another embodiments of composites according to the present invention.
Figure 8:
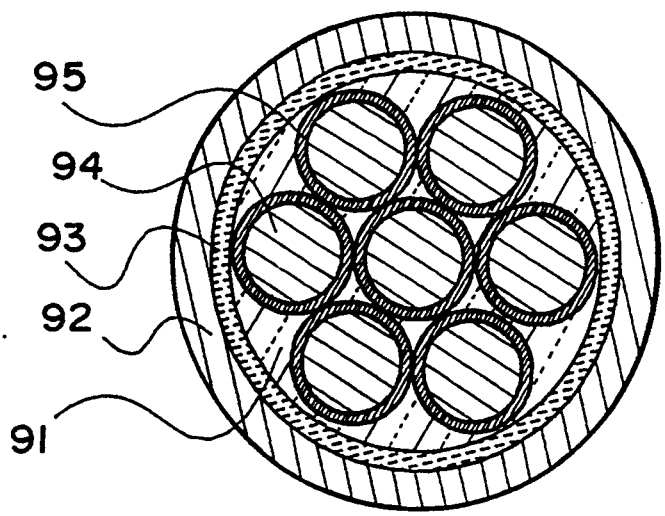
Figure 9:
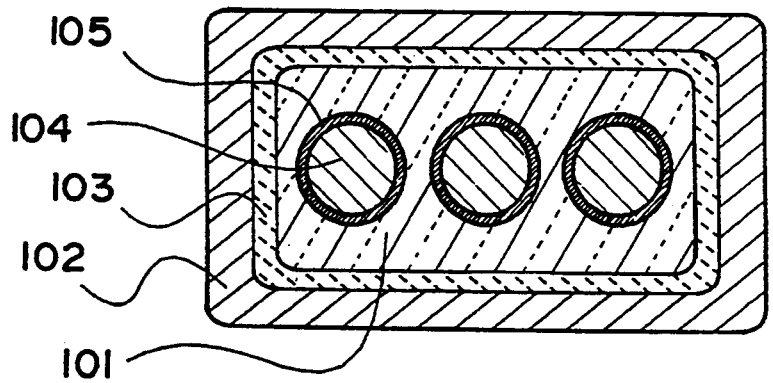

FIG. 7, 8 and 9 show three variations of solid composite according to the present invention. In these embodiments, a plurality of platinum wires 84, 94 and 104 are embedded in a core of compound oxide type superconductor 8 1, 91 and 101 which is surrounded by an outer platinum pipe 82, 92 or an outer platinum band 102. In the embodiments shown, an oxide layer of PrO 83, 93 and 103 is interposed at an interface between the core 81, 91 and 101 and the outer sheath 82, 92 and 102. The oxide layer 83, 93 and 103 can be produced easily by heating in air an inner surface of the outer sheath 82, 92 and 102 to oxidize the same. The existence of the oxide layer 83, 93 and 103 is preferable to prevent the oxygen contents in the sintered compound oxide from being influenced by chemical reaction with a material of the pipe.

The composite shown in FIG. 8 is similar to that of FIG. 7, but contains a larger number and/or thicker platinum wires 94 in the superconducting compound oxide core 91. In fact, if superconductivity is broken accidentally, a very high intensity of electric current must be passed by through the ordinary conductors composed of the outer metal pipe 92 and embedded wires 94. Therefore, the embodiment shown in FIG. 8 is preferable for applications requiring higher current intensity such as electromagnets used in a strong magnetic field.

Figure 10:
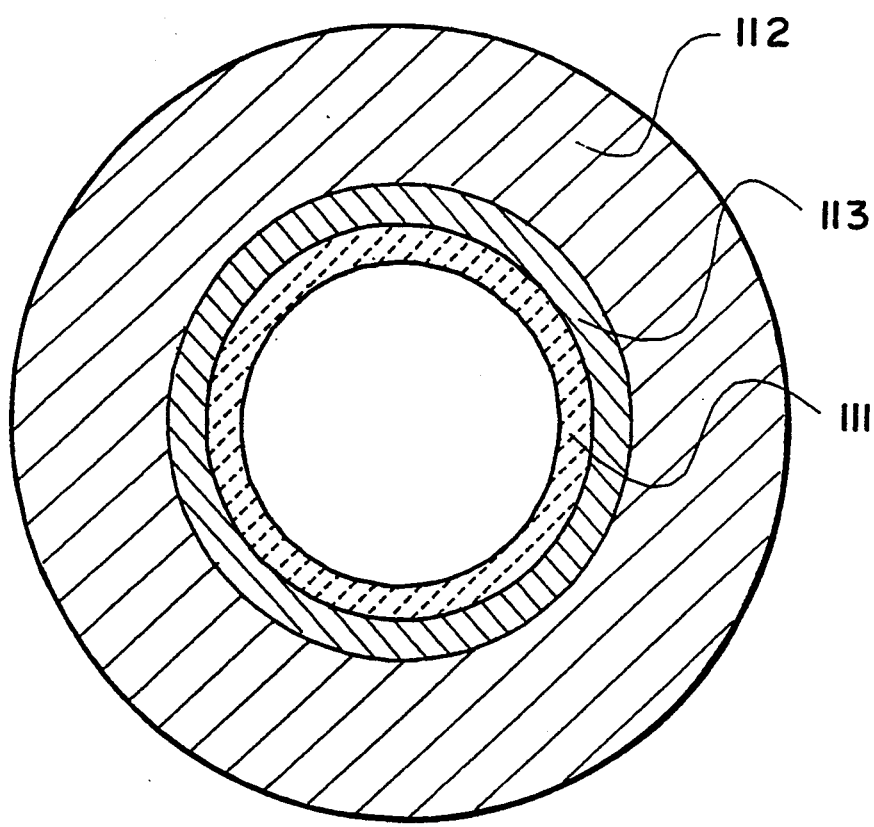
FIG. 10 is a cross section of a hollow composite according to the present invention.

FIG. 10 illustrate a hollow composite according to the present invention. In this embodiment, an outer metal pipe 112 may be made of precious metals and any other metals such as copper. However, in the case that the outer pipe 112 is not made of precious metal, an inner surface of the pipe 112 must have an inner lining layer or intermediate layer of precious metal 113. This inner lining layer can be produced by conventional technique such as vacuum-deposition, sputtering, electroplating etc.

A hollow composite such as shown in FIG. 10 can be produced by the following steps:

At first, powders of $Y_2O_3$, $Ba_2CO_3$ and CuO were mixed with such an atom ratio of Y : Ba: Cu becomes to 1 : 2: 3 and then the resulting mixture was compacted and preliminarily sintered at 820° C. Then, the sintered mass is pulverized and compacted again. This compact is further sintered at 1,080° C. to produce a sintered block which is used as a target for sputtering.

Figure 11:
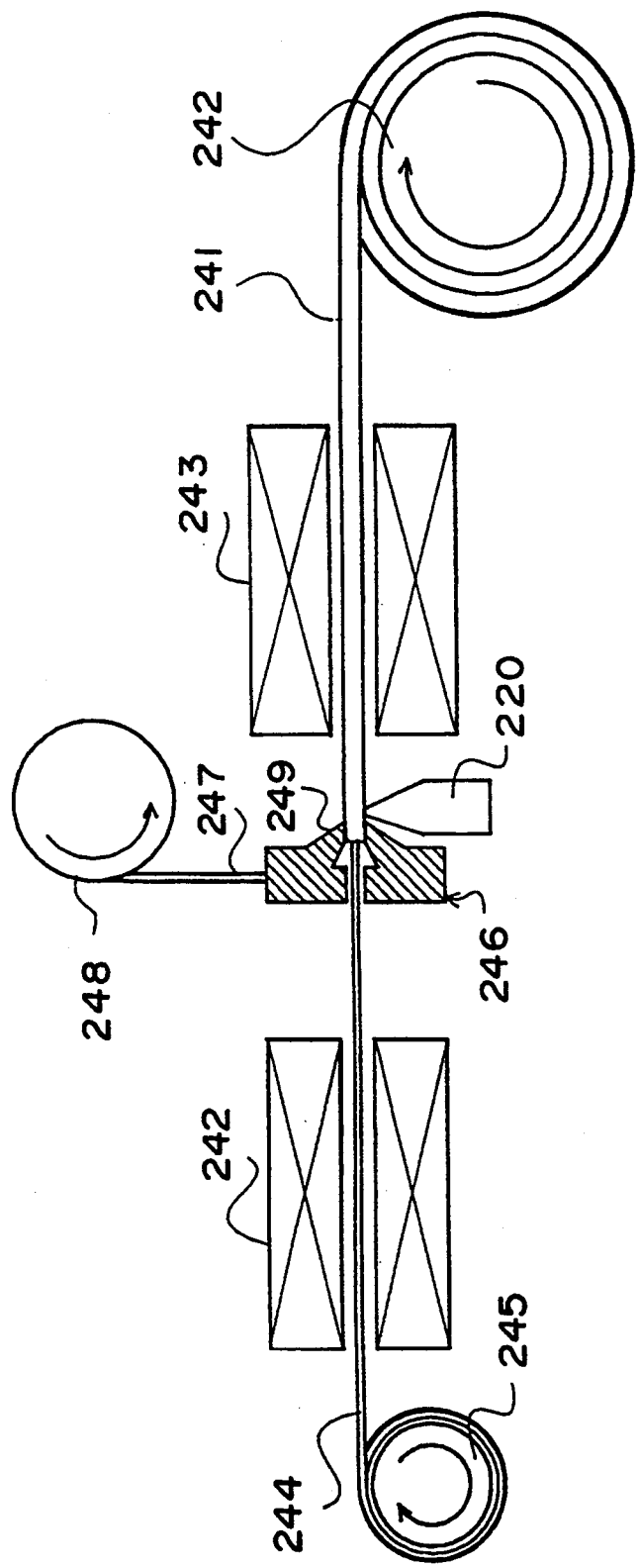
FIG. 11 is an illustrative view of an apparatus which can be used for manufacturing continuously a composite having a tape-like configuration according to the present invention.

Following is sputtering conditions to produce a thin film layer of superconducting compound oxide on an inner surface of a platinum layer deposited on an inner surface of a copper pipe having an inner diameter of 50 mm, a wall thickness of 2 mm and a length of 100 mm:

Oxygen partial pressure $4 \times 10^{-2}$ Torr
Argon partial pressure $3 \times 11^{-2}$ Torr
Substrate temperature: 700° C.
Substrate bias voltage: –600 V
High-frequency powder: 25 W/cm$^2$
Deposition rate: 0.5 Å/sec
Total thickness: about 1 μm FIG. 11 is a illustrative and diagrammatical drawing of an apparatus which can be applied to production of a composite according to the present invention continuously.

In this case, the material ceramic powder is preferably blended with organic binder and can be prepared as following:

At first, powders of $Y_2O_3$, $Ba_2CO_3$ and CuO each having purity of more than 3N and an average particle size of 5 μm were mixed with such an atom ratio that the proportions of Ba, Y and Cu in a composition of $(Ba_{1-x}Y_x)Cu_yO_z$ correspond to values of x=0.2 and y=1 and then the resulting mixture was sintered in air at 920° C. for 12 hours. Then, the sintered mass is pulverized in mortar. After the same procedure of sintering and pulverization is repeated for three times the resulting, sintered powder is ground by high purity alumina balls in a ball mill for 5 hours to obtain a material powder having an average particle size of less than 5 μm.

The material powder is mixed and kneaded with a binder of PVB (polyvinylbutylal) in a solvent of toluene containing a plasticizer of DBP (dibutylphtharate). The resulting paste is shaped into a sheet having a thickness of 0.8 ram, a width of 300 mm and a length of 5 m and dried to ready to be used in an apparatus shown in FIG. 11.

The apparatus shown in FIG. II includes a continuous furnace being provided with two heating zones of a binder-removing zone 242 and a sintering zone 243. An elongated shaped tape or wire 244 is supplied to an inlet of the binder-removing zone 242 from a coiler 245. The elongated article 244 unwound from the toiler 245 is fed continuously to the binder-removing zone 242 in which the elongated article 244 is heated at a temperature of 400° to 700° C. to remove the binder out of the elongated article 244.

After the binder-removing zone 242, the elongated article 244 is passed to a continuous lining station 246 which is positioned at the downstream of the binder-removing, zone 242. The continuous lining station 246 is provided with a drum 248 for feeding a sheet 247 of precious metal or alloy to a guide 249 where the sheet 247 is wound around the elongated article 247. A seam of the wound sheet 247 is welded by means of a laser welder 220 so that the elongated article 244 is wrapped by the metal sheet 247.

The resulting composite comprising the elongated article 244 and the covering sheet or outer sheath 247 is then passed to the sintering zone 243 where the composite is heated at a temperature of 850° to 950° C. in oxygen containing atmosphere to sinter the elongated article. The longitudinal dimension or length of the sintering zone 243 and the advancing velocity of the composite can be adjusted in such manner that the sintering is performed completely.

The product 241 thus obtained is cooled down slowly at a cooling speed of 8° C./min and may be wound about a drum 242 for stock. The product possesses enough flexibility and self-supporting properties, since the elongated article 244 contains the binder. The apparatus shown in FIG. 11 permits to carry out the sintering operation continuously at a higher productivity.

The product produced by the abovementioned apparatus is further heat-treated for example at 700° C. for 36 hours under oxygen containing atmosphere to obtain a superconducting composite shown in FIG. 3B.

The composite shown in FIG. 9 can be also produced by the apparatus shown in FIG. 11. In this case, when the paste is shaped into a sheet having a thickness of 0.8 mm, a width of 300 mm and a length of 5 m, for example fifty platinum wires whose surface is oxidized previously ar embedded in the sheet and dried to ready to be used in an apparatus shown in FIG. 11. In the apparatus, the binder is removed at 400° to 700° C. and a silver sheath is put around the sheet. The resulting composite is heated in air at 935° C. for 5 hours to sinter the sheet.

The composite comprising the elongated compound oxide and the outer metal sheath produced by the present invention can be shaped or deformed into a desired configuration such as a coil or the like due to the higher flexibility and self-supporting property, so that the sintering can be performed in the condition of the coiled configuration or in a condition that the coiled is supported on any other conductive body. The existence of the sheath of Pt metal or its alloy also increase the deflective strength.

The composites obtained by the abovementioned processes according to the present invention can be utilized in a variety of applications of superconductors as they are. However, when a clearance which may occur eventually between the outer metal pipe and the sintered compound oxide core is undesirable, the composite can be further caulked or wire-drawn under moderate condition during the sintering operation or before the composite loses heat. The wire-drawing is preferably performed during the sintering stage.

In still another variation, the outer metal pipe may have a plurality of axial recesses or holes or bores in which the material powder is filled which is sintered according to the process described hereabove. In this structure, the outer metal pipe functions as a heat radiant passage during quenching stage and a bypass of electric current when superconductivity is broken.

It is apparent from the description abovementioned that there is no possibility of chemical reduction of the sintered compound oxide with the outer metal pipe and hence the superconductor is stabilized chemically, because the pipe is made of precious metal or has an interface layer made of precious metal. Namely, the resulting ceramic wire exhibits improved property of superconductivity due to its crystal structure and oxygen deficiency which are critical factor in perovskite type or quasi-perovskite type superconductors is assured. Still more, since the composite of the present invention is isolated from oxidatative atmosphere because of the presence of the outer metal sheath, the perovskite type or quasi-perovskite type superconductors which has not higher resistance to oxidation can be protected from surrounding atmosphere effectively.

The composites obtained by the present invention can be utilized as superconducting wires or parts due to their high and stable Tc.

DESCRIPTION OF THE PREFERRED EMBODIMENTS

SUPERCONDUCTOR

One of preferred embodiment of the compound oxide from which the superconductor is composed is a compound oxide represented by the general formula:

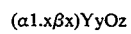

$(\alpha_{1-x}\beta_x)Y_yO_z$ in which $\alpha$ stands for an element selected from IIa group of the Periodic Table, $\beta$ stands for an element selected from IIIa group of the Periodic Table and Y stands for an element selected from a group comprising Ib, IIb, IIIb and VIII group of the Periodic Table, and a small letter of "x" represents an atomic ratio of $\beta$ and is a number which satisfies a range of $0.1 \leq x \leq 0.9$ with respect to the total of $(\alpha + \beta)$ which is equal to 1, small letters of "y" and "z" represent atomic ratios of Y and oxygen (O) respectively and satisfy ranges of $1.0 \leq y \leq 4.0$ and $1 \leq z \leq 5$ respectively.

The superconducting compound oxide have preferably perovskite type structure or quasi-perovskite type structure. The term of "quasiperovskite type structure" means any oxide that can be considered to have such a crystal structure-that is similar to perovskite-type oxides and may include an orthorhombically distorted perovskite or a distorted oxygen-deficient perovskite or the like.

In practice, the element ct is preferably selected from Ba, Sr and/or Ca and the element $\beta$ is preferably selected from Y, La and/or lanthanid such as Sc, Ce, Gd, Ho, Er, Tin, Y b, Lu and the element $\gamma$ is preferably Cu.

It can be mentioned, as preferred compound oxides obtained by combinations of these elements, Ba-Y-Cu-O type oxide such as $YBa_2Cu_3O_{7-\delta}$, Ba-La-Cu-O type oxide or Sr-La-Cu-O type oxide such as $[La_{1-x}, Ba_x]_2CuO_{4-y}$, in which x and y are numbers which are less than 1. In case of Ba-Y-Cu type compound oxides, a proportion of from 10 to 80% of Ba may be substituted by one or two elements selected from a group comprising Mg, Ca and Sr and/or a proportion of from 10 to 80% of Y may be substituted by one or two elements selected from a group comprising La and lanthanid. If the proportions of the substituents become outside of the abovementioned range of from 10 to 80%, no improvement of superconductivity is expected.

In the preferred embodiment, the compound oxide type superconductor can be prepared from a material powder which may be (i) a powder mixture of oxide powders or carbonate powders of constituent elements of a compound oxide to be produced, such as $BaCO_3$, $Y_2O_3$, CuO or (ii) a sintered powder of compound oxide prepared by sintering the powder mixture of (i) and then by pulverizing obtained sintered mass such as $YBa_2Cu_3O_{7-d}$ or $[La_{1-x}, Ba_x]_2CuO_{4-y}$.

The sintered powder mixture (ii) is preferable to facilitate control of proportions of the constituent elements in the material powder in order to obtain a uniform product of sintered compound oxide having a proper proportions of the constituent elements The material powder may be prepared also from fluoride, nitrate, sulfate, or the like in addition to or in place of the oxide and carbonate.

According to a preferred embodiment, additional operations such as wire-drawing, heat-treatment or annealing can be carried out before or after or during the sintering operation. Namely, after a powder mixture of compounds is compacted in a metal pipe made of precious metals such as gold, silver or platinum metals, the pipe is subjected to a series of operations comprising annealing, wire-drawing and sintering.

The wire-drawing may be performed by any means including dies, roller dies, rolling mill, swaging units or extruder. The sintering can be carried out at a temperature ranging, between an upper limit which is defined by a melting point which corresponds to the lowest melting point of any one of constituent components in the material powder and a lower limit which is lower by 100° C. than said upper limit The annealing can be carried out at a temperature which is lower than the sintering, temperature, preferably lower than 160° C. Cooling of heated composite after the annealing and sintering operations is carried out at a cooling speed of lower than 50° C./min, more particularly lower than 10° C./min. It is also possible to remove the outer metal pipe after the annealing or wire-drawing.

According to another preferred embodiment, after a powder mixture of compounds is compacted in a metal pipe made of silver, the pipe is subjected to a series of operations comprising annealing, wire-drawing, intermediate sintering, wire-drawing and sintering.

According to still another preferred embodiment, an additional outer metal layer is formed on an outer surface of the pipe. Namely, after a powder mixture of compounds is compacted in a metal pipe and the pipe is subjected to annealing and wire-drawing, an additional outer metal layer is applied on the outer surface of the pipe and then the resulting pipe is wire-drawn before the composite is heated to sinter the material powder.

In this case, the additional outer metal layer can be formed by plating technique or caulking or cladding technique in which a metal pipe having a larger inner diameter than the composite pipe is put on the composite pipe and then is caulked tightly on the outer surface of the composite pipe. In this case also, after the pipe filled with the material powder therein is wire-drawn, it is possible to remove the outer metal pipe at the same time when the material powder is sintered. The sintered composite is cooled at a lower cooling speed.

The dimensional reduction ratio of the wire-drawing is preferably within a rage of 16 to 92%.

According to still another embodiment, after a powder mixture of compounds is compacted in a metal pipe and the pipe is wire-drawn, the pipe is subjected to a series of operations comprising annealing, wire-drawing and sintering. The steps from the wire-drawing, annealing and second wire-drawing may be repeated for several times.

Another type superconductors which are applicable to the present invention include following compound oxides:

(i) a compound oxide including at least two elements $\alpha 1$ and $\alpha 2$ selected from IIa group of the Periodic Table, an element $\delta$ selected from Va group of the Periodic Table and an element $\gamma$ selected from a group comprising Ib, IIb, IIIb and VIII group of the Periodic Table. Particularly, the elements $\alpha 1$ and $\alpha 2$ are preferably Sr and Ca, the element $\delta$ is preferably Bi and the element $\gamma$ is preferably Cu such as a case of Ca-Sr-Bi-Cu type oxides for example $Ca_2Sr_4Bi_4Cu_6O_{20+\delta}$, and (ii) a compound oxide including at least two elements $\alpha 1$ and $\alpha 2$ selected from IIa group of the Periodic Table, an element $\epsilon$ selected from IIIa group of the Periodic Table and an element $\gamma$ selected from a group comprising Ib, IIb, IIIb and VIII group of the Periodic Table. Particularly, the element $\alpha 1$ and $\alpha 2$ is preferably Ba and Ca, the element $\delta$ is preferably TI and the element $\gamma$ is preferably Cu such as a case of $TI_4Ba_4Ca_4Cu_6O_{20+\delta}$.

Now, the process according to the present invention will be described with reference to illustrative Examples, but the scope of the present invention should not be limited thereto.

Example 1

A powder mixture of $Ba(NO_3)_2$, $Y(NO_3)_3$ and CuO each having purity of 99.9% was kneaded at a atom ratio of Y : Ba : Cu = 1 : 2 : 3 in ethanol and then sintered previously at 700° C. for 3 hours. The sintered mass obtained was then pulverized in a ball mill to prepare a sintered powder having a particle size of less than 10 μm.

The sintered powder was compacted in a pipe made of silver having an outer diameter of 10 mm and a wall thickness of 1 mm and then sintered at 910° C. for 7 hours. At the end of the sintering stage and during the pipe is in a heated condition, the pipe was subjected to wire-drawing to reduce its outer diameter to 8 mm and then cooled at a cooling speed of 15° C./min.

Then, the pipe was re-heated at 300° C. for 20 minutes and then cooled at a cooling speed of 10° C./min.

According to a usual method, two pairs of electrodes were soldered on a sample (30 cm long) cut from the resulting composite with silver paste and then the sample was immersed in liquidized nitrogen in a cryostat to cool the composite down to a temperature where no resistance was observed. Then, the temperature dependence of resistance of the sample was determined with rising the temperature gradually. The results revealed that the sample of wire showed a temperature of 117 K. where an ordinary resistance was observed.

The temperature dependence of resistance was determined by four probe method in cryostat and temperature was measured by a calibrated Au(Fe)-Ag thermocouple.

The superconducting property of this sample was preserved up to a curvature of 100 mm under a curved configuration.

Example 2

The same procedure as Example 1 was repeated except that the sintered powder was compacted in a pipe made of platinum.

The result revealed that the sample obtained showed the same temperature of 117 K. where an ordinary resistance was observed as Example 1.

Example 3

20.8% by weight of commercially available $Y_2O_3$ powder, 54.7% by weight of commercially available $BaCO_3$ and 24.5% by weight of commercially available CuO were mixed in an attritor in wet and then dried. The dried powder was press-molded at a pressure of 100 kg/cm$^2$ and then sintered at 880° C. in air for 24 hours and then was pulverized and passed through a sieve to obtain powder of 100 mesh-under. The abovementioned operations from the sintering to screening were repeated for three times.

After treatment of granulation, the granulated material powder was compacted into a platinum pipe having an outer diameter of 5 mm, an inner diameter of 4 mm and a length of 1 m and opposite ends of the pipe were closed.

The resulting platinum pipes filled with the material powder was subjected to wire-drawing to reduce its outer diameter down to 4 mm and then was heated in air to sinter the material powder at 930° C. for 3 hours during which the outer platinum pipe was peeled off by a die through which the pipe was passed. After then, the product was cooled at a cooling speed of 8° C./min to obtain a sintered ceramic wire having a thin film layer of platinum of 0.05 mm thick.

Observation of a cross section of the sintered ceramic wire revealed such a fact that a thin surface layer of 0.4 mm thick of the ceramic wire turn red because CuO was reduced to Cu while the central portion of the sintered ceramic wire was left in a dark green color of perovskite. Measurement of the critical temperature (Tc) of this superconducting wire of perovskite showed a value of 45 K.

The same procedure was repeated as above except that a finer platinum pipe having an outer diameter of 3 mm and an inner diameter of 2 mm was used and wire-drawn with higher dimensional reduction ratio of up to a final outer diameter of 2.4 min. In this case, no reduction of CuO was observed but the resulting sintered ceramic wire consisted totally of the perovskite having the critical temperature of 97 K.

Example 4

20.8% by weight of commercially available $Y_2O_3$ powder, 54.7% by weight of commercially available $BaCO_3$ and 24.5% by weight of commercially available CuO were mixed in an attoriter in wet and then dried. The dried powder was press-molded at a pressure of 100 kg/cm$^2$ and then sintered at 880° C. in air for 24 hours and then was pulverized and passed through a sieve to obtain powder of 100 mesh-under. The abovementioned operations from the sintering to screening were repeated for three times.

The obtained sintered material powder was compacted into a platinum pipe having an outer diameter of 5 mm, an inner diameter of 4 mm and a length of 1 m and opposite ends of the pipe were closed. The resulting platinum pipe filled with the material powder was heated to 600° C. and then annealed.

20 samples of the annealed platinum pipes were passed through a series of roller dies to obtain the final outer diameter of 1.0 mm under such condition that the dimensional reduction ratio in cross sectional direction per one reduction unit block was 38%. In this case, breakage of pipes were observed at such frequencies as are shown in Table 1.

TABLE 1

| Diameter when breakage occurred | Frequency of breakage |
| --- | --- |
| No breakage occurred up to 1.0 mm | 1 |
| Breakage occurred between 1.0 mm and 1.1 mm | 8 |
| Breakage occurred between 1.1 mm and 1.5 mm | 7 |
| Breakage occurred between 1.5 mm and 2.0 mm | 3 |
| Breakage occurred between 2.0 mm and 2.4 mm | 1 |

The same procedure as above was repeated except that the Pt pipes filled with the sintered powder were wire-drawn through a stationary die. In this case, the frequency of breakage increased five times more than the abovementioned wire-drawing by roller dies.

Both of five samples prepared by roller dies and one sample which could be drown up to a diameter of 1.0 mm without any breakage by the conventional stationary die were sintered at 750° C. for 20 minutes. Then, reduction in cross section of the pipes was repeated by the roller dies and by the stationary dies for respective samples to obtain an outer diameter of 0.3 min. The result revealed that the five samples passed through roller dies could be drawn up to the final diameter of 0.3 ram, while the one sample passed through the stationary die broke at a diameter of 0.42

Then, all of the samples were subjected to the final sintering at 850° C. for 5 hours. When the sintering completed, the composite was cooled at a cooling rate of 10° C./min. Then, the critical temperature (Tc) was measured on the sample which was passed through roller dies to a diameter of 0.3 mm and sintered at 930° C. for 3 hours.

Measurement of the critical temperature was carried out by a conventional four probe method in witch, after electrodes were connected to the resulting wire with conductive silver paste, the wire was immersed in liquidized hydrogen to cool the wire down to a temperature of 25 K. in a cryostat. Temperature is measured by a calibrated Au(Fe)-Ag thermocouple. Then, the temperature dependence of resistance of the sample was determined with rising the temperature gradually. The results revealed that the sample of the present invention exhibited superconductivity up to relatively higher temperature of 99 K.

For comparison, the critical temperature of the sample prepared by the stationary die was also measured The result revealed that the critical temperature of the comparative example is 20 K. lower than the critical temperature of the sample prepared by the roller dies.

This discrepancy might be caused by fine cracks produced inside the ceramic wire. This fact was also supported by measurement of current density in which the sample obtained by the roller dies showed higher critical density than the sample prepared by the stationary dies.

Example 5

The same sintered material powder as Example 4 was used and was compacted into a platinum pipe having an outer diameter of 5 mm, an inner diameter of 4 mm and a length of 1 m and opposite ends of the pipe were closed. The resulting platinum pipe filled with the material powder was heated to 880° C. for 2 hours and then annealed. The annealed platinum pipes was passed through a series of roller dies to reduce to an outer diameter of 4.1 min.

Then, after the pipe was further heated at 900° C. for 1 hours and then annealed, its diameter was further reduced to 3.2 min. A piece of the resulting pipe was slitted axially and examined microscopically to find innumerable cracks of less 0.8 mm width in the sintered ceramic mass which might be caused by cold working on the sintered ceramic.

The ceramic wire of 3.2 mm in diameter was then further heated at 930° C. for 5 hours and cooled slowly at a cooling speed of 10° C./min. The resulting pipe was slitted again axially and examined microscopically to find no crack. The critical temperature of this ceramic wire was 101 K. The critical temperature and resistance were determined by the same method as Example 4.

Example 6.

The same procedure as Example 4 was repeated to obtain samples of composites each having an outer diameter of 0.3 mm and comprising an outer platinum pipe and a sintered mass surrounded tightly by the platinum pipe. The samples were however lacking in uniformity, namely the variation in diameter of these samples was ±0.16 mm. Still more, the outer platinum pipe had not enough strength to breakage.

Therefore, another platinum pipe having an outer diameter of 3 mm and an inner diameter of 1.5 mm was put on one of the samples having an outer diameter of 1.0 mm obtained in Example 4 and was caulked to obtain a cladded composite. This cladded composite was further wire-drawn to a diameter of 1.5 mm and then sintered at 930° C. for 3 hours and cooled slowly at a cooling speed of 10° C./min. The resulting product showed a uniform appearance and had the reduced variation in diameter of ±0.005 min. This product maintained a relatively higher superconductivity up to 97 K. The critical temperature and resistance were determined by the same method as Example 4.

Example 7

85.5% by weight of commercially available $La_2O_3$ powder, 3.1% by weight of commercially available $SrCO_3$ and 11.4 % by weight of commercially available CuO were mixed in an attritor in wet and then dried. The dried powder was press-molded at a pressure of 100 kg/cm$^2$ and then sintered at 900° C. in air for 20 hours and then was pulverized and passed through a sieve to obtain powder of 100 mesh-under.

After the obtained sintered material powder was granulated, it was compacted into a platinum pipe having an outer diameter of 5 mm, an inner diameter of 4 mm and a length of 1 m and opposite ends of the pipe were closed. The resulting platinum pipe filled with the material powder was heated to 1,050° C. for 2 hours, resulting in that almost all of platinum was fused off the sintered ceramic core to obtain a wire of 7.7 mm long coated with a Pt layer of 0.01 to 0.06 mm thick. The variation in diameter reduced to ±0.006 mm. This product maintained a relatively higher superconductivity up to 105 K. The critical temperature and resistance were determined by the same method as Example 4.

Example 8

Powders of Ba, $Y_2O_3$ and CuO were used. A mixture of 20.8% by weight of $Y_2O_3$ powder, 54.7% by weight of Ba powder and 24.5% by weight of CuO powder were mixed in a molter and was press-molded. The resulting compact was sintered at 940° C. for 15 hours. The sintered mass was then pulverized and passed through a sieve to obtain powder of 100 mesh-under. The sequence of the press-molding, sintering and pulverization was repeated for three times to obtain a material powder.

Following four kinds of pipes were used:
(i) Copper pipe having an outer diameter of 20 mm and an inner diameter of 15 mm,
(ii) Silver pipe having an outer diameter of 20 mm and an inner diameter of 15 mm,
(iii) Copper pipe having an outer diameter of 20 mm and an inner diameter of 15 mm and having a inner lining layer of silver, and
(iv) Copper pipe having an outer diameter of 20 mm and an inner diameter of 15 mm and having a inner lining layer of gold, After the sintered material powder was compacted in these pipes, opposite ends of each pipe were closed. Then, the pipes were subjected to swaging work to reduce their outer diameter to 6 mm. The resulting pipes filled with the material powder were heated to 950° C.

The critical temperatures of the resulting composites were determined by the same method as Example 4. The result is shown in the following Table:

| pipe | Critical temperature (K) |
| --- | --- |
| (i) | 63 |
| (ii) | 94 |
| (iii) | 92 |
| (iv) | 93 |

Example 9

The same sintered material powder as Example 4 was used and was compacted into a variety of silver-copper alloy pipes each having an outer diameter of 5 mm, an inner diameter shown in the following Table and a length of 1 m. Then, the pipes were subjected to wire-drawing work to reduce their diameters to 3.6 mm.

These pipes filled with the material powder were heated to 930° C. for 3 hours in air to obtain sintered ceramic wires covered with Ag-Cu alloy coating.

Each samples of the resulting pipes were cut to be examined microscopically to find no chemical reduction of sintered oxide to CuO but to find formation of a layer of Ag-CuO caused by internal oxidation of the Ag-Cu pipes.

The following Table summarizes the kind of alloys used, the inner diameters of the pipes, and the critical temperatures of the resulting composites.

| No | alloy | Vickers Hardness | Inner Dia. (mm) | Critical temperature (K) |
| --- | --- | --- | --- | --- |
| 1 | Ag—2.8%Cu | 42 | 4 | 63 |
| 2 | Ag—2.8%Cu | 42 | 4.3 | |
| 3 | Ag—10%Cu | 64 | 4 | 66 |
| 4 | Ag—10%Cu | 64 | 4.3 | 70 |
| 5 | Ag—20%Cu | 85 | 4 | 62 |
| 6 | Ag—20%Cu | 85 | 4.3 | 69 |
| 7 | Ag—30%Cu | 103 | 4 | 65 |
| 8 | Ag—30%Cu | 103 | 4.5 | 78 |

Example 10

The same powder mixture as Example 1 was compacted in a Ag-30%Cu alloy pipe and having an outer diameter of 5 mm and a wall thickness of 1 mm and then sintered at 910° C. for 7 hours. At the end the sintering stage and during the pipe is in a heated condition, the pipe was subjected to wire-drawing to reduce its outer diameter to 3.5 mm and then cooled at a cooling speed of 15° C./min.

Then, the pipe was re-heated at 300° C. for 20 minutes and then cooled at a cooling speed of 10° C./min.

According to a usual method, two pairs of electrodes were soldered on a sample (30 cm long) cut from the resulting composite with indium paste and then the temperature dependence of resistance of the sample was determined with rising the temperature gradually. The results revealed that the sample of wire showed a temperature of 74 K. where an ordinary resistance was observed. The temperature dependence of resistance was determined,by the same method as Example 1.

The superconducting property of this sample was preserved up to a curvature of 100 mm under a curved configuration.

Example 11

The same material powder as Example 3 was compacted in a Ag-20%Cu alloy pipe having an outer diameter of 5 mm and an inner diameter of 4 mm and opposite ends of the pipe was closed. The pipe filled with the material powder therein was subjected to wire-drawing work to reduce its outer diameter to 4 mm and then was heated at 930° C. for 3 hours to sinter the material powder. The resulting composite was cooled slowly at a cooling speed of 8° C./min to obtain a sintered ceramic wire coated with a Ag-20%CuO alloy layer of 0.05 mm thick.

No chemical reduction of the sintered ceramic wire was observed on a cross section thereof but appearance of perovskite color was observed.

The critical temperature of this superconducting wire was 75 K.

Example 12

The same dried powder as Example 7 was press-molded at a pressure of 100 kg/cm² and then sintered at 840° C. in air for 3 hours and then was pulverized and passed through a sieve to obtain powder of 100 mesh-under.

After the obtained sintered material powder was granulated, the material powder was compacted in a Ag-10%Cu alloy pipe having an outer diameter of 5 mm, an inner diameter of 4 mm and a length of 1 m and opposite ends of the pipe was closed.

The pipe filled with the material powder therein was subjected to wire-drawing work to reduce its outer diameter to 3.4 mm and then was heated at 940° C. for 12 hours in vaccum to sinter the material powder. The resulting wire coated with a Ag-10%CuO alloy layer of 0.01 to 0.06 mm thick.

The critical temperature of this superconducting wire was 79 K.

What is claimed are:

1. A process for producing a composite wire comprising a compound oxide superconductor and an outer metal pipe on which said superconductor is supported, comprising the steps of preparing at least one of material powders selected from the group consisting of
   (i) a powder mixture of compounds each containing at least one of constituent elements of said compound oxide and
   (ii) a sintered powder of compound oxide prepared by sintering the powder mixture of (i) and then by pulverizing obtained sintered mass,
   compacting the material powder in said outer metal pipe made of at least one of metals selected from the group consisting of gold, silver platinum metals and their alloys, and then heating the metal pipe filled with the material powder at a temperature ranging between an upper limit which is defined by a melting point which corresponds to the lowest melting point of any one of constituent components in the material powder and a lower limit which is lower by 100° C. than said upper limit to sinter said material powder inside the outer metal pipe and then cooling the product at a cooling velocity of less than 50° C./min, wherein said compound oxide is selected from the group consisting of:
   1) a compound oxide of Ba, Y and Cu,
   2) a compound oxide of Sr, La, and Cu,
   3) a compound oxide of Sr, Ca, Bi and Cu, and
   4) a compound oxide of Ba, Ca, Tl and Cu, and
   further including a series of steps comprising wire-drawing the metal pipe filled with the material powder, annealing the wire-drawn product, performing intermediate sintering, further wire-drawing the sintered product, and then carrying out the final sintering, and further characterized in that the wire-drawing, intermediate sintering, and further wire-drawing are repeated a plurality of times.

2. A process set forth in claim 1, wherein each of said compounds is an oxide powder or carbonate powder of constituent elements of said compound oxide.

3. A process set forth in claim 1, wherein an atomic ratio of elements in said material powders is adjusted to the same value as an atomic ratio of constituent elements in said compound oxide to be produced.

4. A process set forth in claim 1 wherein said compound oxide is of quasi-perovskite oxide.

5. A process for producing a composite wire comprising a compound oxide superconductor and an outer metal pipe on which said superconductor is supported, comprising the steps of preparing at least one of material powders selected from the group consisting of
   (i) a powder mixture of compounds each containing at least one of constituent components in the material powder and
   (ii) a sinter powder of compound oxide prepared by sintering a powder mixture of (i) and by pulverizing the obtained sintered mass,
   depositing an intermediate layer made of at least one of metals selected from the group consisting of gold, silver, platinum metals and their alloys on an inner surface of said outer metal pipe, depositing a layer of said material powder on an inner surface of said intermediate layer, and then heating the metal pipe having said intermediate layer and said material powder layer at a temperature ranging between an upper limit which is defined by a melting point which corresponds to the lowest melting point of any one of constituent components in the material powder and a lower limit which is lower by 100° C. than said upper limit to sinter said material powder inside the outer metal pipe and then cooling the product at a cooling velocity of less than 50° C./min, wherein said compound oxide is selected from the group consisting of:
1) a compound oxide of Ba, Y and Cu,
2) a compound oxide of Sr, La, and Cu,
3) a compound oxide of Sr, Ca, Bi and Cu, and
4) a compound oxide of Ba, Ca, Tl and Cu.

6. A process set forth in claim 5, wherein said outer metal pipe is made of material selected from the group consisting of Ag, Au, Pd, Pt, Rh, Ir, Ru, Os and their alloys.

7. A process set forth in claim 5, wherein each of said compounds is an oxide powder or a carbonate powder of constituent elements of said compound oxide.

8. A process set forth in claim 5 wherein an atomic ratio of elements in said material powders is adjusted to the same value as an atomic ratio of constituent elements in said compound oxide to be produced.

9. A process set forth in claim 8 wherein said compound oxide is of quasi-perovskite oxide.

10. A process for producing a composite wire comprising a compound oxide superconductor and an outer metal pipe on which said superconductor is supported, comprising the steps of preparing at least one of material powders selected from the group consisting of
(i) a powder mixture of compounds each containing at least one of constituent components in the material powder and
(ii) a sinter powder of compound oxide prepared by sintering a powder mixture of (i) and by the pulverizing obtained sintered mass,
depositing a layer of said material powder on an inner surface of said outer metal pipe made of at least one of metals selected from the group consisting of gold, silver, platinum metals and their alloys on an inner surface of said outer metal pipe, and then heating the metal pipe having said material powder layer at a temperature ranging between an upper limit which is defined by a melting point which corresponds to the lowest melting point of any one of constituent components in the material powder and a lower limit which is lower by 100° C. than said upper limit to sinter said material powder on the outer metal pipe, so that said compound oxide-type superconductor is in a form of a layer supported on the inner surface of the outer metal pipe to provide an axial hollow interior passage in the pipe and then cooling the product at a cooling velocity of less than 50° C./min, wherein said compound oxide is selected from the group consisting of:
1) a compound oxide of Ba, Y and Cu,
2) a compound oxide of Sr, La, and Cu,
3) a compound oxide of Sr, Ca, Bi and Cu, and
4) a compound oxide of Ba, Ca, Tl and Cu.

11. A process set forth in claim 10, wherein the material powder layer is deposited on the inner surface of the metal pipe by a sputtering technique.

12. A process set forth in claim 10, wherein each of said compounds is an oxide powder or a carbonate powder of constituent elements of said compound oxide.

13. A process set forth in claim 10, wherein an atomic ratio of elements in said material powders is adjusted to the same value as an atomic ratio of constituent elements in said compound oxide to be produced.

14. A process for producing a composite wire comprising a compound oxide superconductor and an outer metal pipe on which said superconductor is supported, comprising the steps of preparing at least one of material powders selected from the group consisting of
(i) a powder mixture of compounds each containing at least one of constituent components in the material powder and
(ii) a sintered powder of compound oxide prepared by sintering a powder mixture of (i) and by the pulverizing obtained sintered mass,
depositing an intermediate layer made of at least one of metals selected from the group consisting of gold, silver, platinum metals and their alloys on an inner surface of said outer metal pipe, compacting the material powder in an outer metal, and then heating the metal pipe filled with said material powder at a temperature ranging between an upper limit which is defined by a melting point which corresponds to the lowest melting point of any one of constituent components in the material powder and a lower limit which is lower by 100° C. than said upper limit to sinter said material powder inside the outer metal pipe and then cooling the product at a cooling velocity of less than 50° C./min, wherein said compound oxide is selected from the group consisting of:
1) a compound oxide of Ba, Y and Cu,
2) a compound oxide of Sr, La, and Cu,
3) a compound oxide of Sr, Ca, Bi and Cu, and
4) a compound oxide of Ba, Ca, Tl and Cu.

15. A process set forth in claim 14, wherein said intermediate layer is made of material selected from the group consisting of Ag, Au, Pd, Pt, Rh, Ir, Ru, Os and their alloys.

16. A process set forth in claim 14, wherein each of said compounds is an oxide powder or carbonate powder of constituent elements of said compound oxide.

17. A process set forth in claim 14, wherein an atomic ratio of elements in said material powders is adjusted to the same value as an atomic ratio of constituent elements in said compound oxide to be produced.

18. A process set forth in claim 1, characterized by including further a step of heat-treatment after the sintered step.

19. A process set forth in claim 18, characterized in that the heat-treatment is carried out at a temperature ranging from 160° C. to 700° C.

20. A process set forth in claim 1, characterized by including further a series of steps comprising sintering, wire-drawing and heat-treatment.

21. A process set forth in claim 1, characterized by a series of steps comprising compacting the material powder in the metal pipe, drawing the metal pipe filled with the material powder, and performing both of sintering of the material powder and removal of the metal pipe.

22. A process set forth in claim 1, characterized in that the wire-drawing is carried out at a dimensional reduction ratio of from 16% to 92%.

23. A process set forth in claim 1, characterized in that said wire-drawing is carried out by means of dies, roller dies, mill rollers, swaging or extrusion.

24. A process set forth in claim 1, characterized in that the cooling after the sintering is performed at a cooling velocity of less than 50° C.

25. A process set forth in claim 24, characterized in that the cooling after the sintering is performed at a cooling velocity of less than 10° C.

26. A process set forth in claim 14, characterized by including further a step of wire-drawing.

27. A process set forth in claim 14 characterized by including further a step of heat-treatment alter the sintered step.

28. A process set forth in claim 27, characterized in that the heat-treatment is carried out at a temperature ranging from 160° C. to 700° C.

29. A process set forth in claim 14, characterized by including further a series of steps comprising sintering, wire-drawing and heat-treatment.

30. A process set forth in claim 1, characterized by including further a series of steps comprising compacting the material powder in the metal pipe, drawing the metal pipe filled with the material powder, and performing both of sintering of the material powder and removal of the metal pipe.

31. A process set forth in claim 26, characterized in that the wire-drawing is carried out at a dimensional reduction ratio of from 16% to 92%.

32. A process set forth in claim 26 characterized by including further a series of steps comprising compacting the material powder in the metal pipe, wire-drawing the metal pipe filled with the material powder, annealing the wire-drawn product, performing intermediate sintering, further wire-drawing the sintered product, and then carrying out the final sintering.

33. A process set forth in claim 32, characterized by repeating the sequence of the steps comprising the wire-drawing, intermediate sintering and further wire-drawing is repeated for plural times.

34. A process set forth in claim 33, characterized in that said wire-drawing is carried out by means of dies, roller dies, mill rollers, swaging or extrusion.

35. A process set forth in claim 34, characterized in that the cooling after the sintering is performed at a cooling velocity of less than 10° C./min.

* * * * *

UNITED STATES PATENT AND TRADEMARK OFFICE
CERTIFICATE OF CORRECTION

PATENT NO. : 5,424,282
DATED : June 13, 1995
INVENTOR(S) : YAMAMOTO et al

It is certified that error appears in the above-indentified patent and that said Letters Patent is hereby corrected as shown below:

Claim 1, line 14, (column 18, line 20), a comma should be inserted between silver and platinum.

Claim 2, line 2, (column 18, line 45), after "or" insert -- a --;

Claim 10, line 25, (column 19, line 55), delete "type";

Claim 16, line 2, (column 20, line 45), after "or" insert -- a --;

Claim 27, line 2, (column 21, line 13), change "alter" to -- after --;

Claim 30, line 1, (column 21, line 21), change "1" to -- 26 --.

Signed and Sealed this

Seventeenth Day of October, 1995

Attest:

BRUCE LEHMAN

Attesting Officer

Commissioner of Patents and Trademarks